(12) United States Patent
Hwang

(10) Patent No.: US 8,022,499 B2
(45) Date of Patent: Sep. 20, 2011

(54) SEMICONDUCTOR MEMORY DEVICE INCLUDING CELL ISOLATION STRUCTURE USING INACTIVE TRANSISTORS

(75) Inventor: Sang Min Hwang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 12/499,263

(22) Filed: Jul. 8, 2009

(65) Prior Publication Data

US 2010/0155798 A1    Jun. 24, 2010

(30) Foreign Application Priority Data

Dec. 23, 2008 (KR) .......................... 10-2008-0132653

(51) Int. Cl.
*H01L 29/78* (2006.01)
*G11C 11/40* (2006.01)
*G11C 16/04* (2006.01)

(52) U.S. Cl. ........... 257/504; 257/E25.012; 365/185.01; 365/185.05

(58) Field of Classification Search .................. 257/349, 257/504, E25.012; 365/185.01, 185.05
See application file for complete search history.

(56) References Cited

U.S. PATENT DOCUMENTS

| | | | |
|---|---|---|---|
| 6,633,073 B2 * | 10/2003 | Rezvani et al. ............... 257/504 |
| 7,081,653 B2 * | 7/2006 | Kawanaka .................... 257/347 |
| 7,692,963 B2 * | 4/2010 | Shino et al. ............. 365/185.05 |
| 7,888,201 B2 * | 2/2011 | Yeo et al. ....................... 438/238 |
| 2003/0013268 A1 * | 1/2003 | Rezvani et al. ............... 438/414 |
| 2007/0058427 A1 | 3/2007 | Okhonin et al. |

* cited by examiner

*Primary Examiner* — Evan Pert
(74) *Attorney, Agent, or Firm* — IP & T Group LLP

(57) ABSTRACT

Disclosed herein is a semiconductor memory device including floating body cells. The semiconductor memory device includes memory cell active regions formed on a Silicon-On Isolator (SOI) semiconductor substrate, a plurality of floating body cell transistors formed in the memory cell active regions, and "inactive transistors" for providing cell isolation that are formed between the plurality of floating body cell transistors. Here, the inactive transistors for providing cell isolation are controlled so that they always are in an OFF state while the semiconductor memory device is operating.

17 Claims, 2 Drawing Sheets

SEMICONDUCTOR MEMORY DEVICE INCLUDING CELL ISOLATION STRUCTURE USING INACTIVE TRANSISTORS

CROSS-REFERENCE TO RELATED APPLICATIONS

The present invention claims priority of Korean patent application number 10-2008-0132653, filed on Dec. 23, 2008, the disclosure of which is incorporated by reference herein in its entirety.

BACKGROUND OF THE INVENTION

1. Field of the Invention

The present invention relates generally to a semiconductor memory device, and, more particularly, to a semiconductor memory device is using floating body cells.

2. Description of the Related Art

With the introduction of a large-scale integration semiconductor device manufacturing process, the most difficult technical problem in the manufacture of DRAM, in which a unit memory cell is formed of one transistor and one capacitor, is to maintain a sufficient data retention time while improving a short channel effect and to fabricate a capacitor having a sufficient capacitance while minimizing dielectric leakage in a narrow area. In particular, the manufacture of a capacitor capable of ensuring reliability while satisfying capacitance necessary for the operation of DRAM has reached the limit of its technology. This technology has drawbacks in terms of process. To solve this problem, active research has been conducted into 1T-DRAM with a memory cell formed of one transistor using the floating body effect of a transistor, as disclosed in, for example, U.S. Patent Application Publication No. US 20070058427 A1.

Meanwhile, in the case of the existing 1T-1C DRAM device, charges are stored in the capacitor. In contrast, a Floating Body Cell (FBC) adopted as the memory cell of 1T-DRAM is used as memory using the change in the threshold voltage (VT) occurring when charges are stored in the body of a transistor. For example, when the transistor operates, impact ionization occurs and, at the same time, holes are created in the floating body. The threshold voltage of the transistor changes depending on whether the created holes are stored or not. This effect is referred to as the "floating body effect." Data "1" or "0" is read based on the change in the is transistor current depending on the change in the threshold voltage. In order to store charges, that is, holes in the floating body, a channel region must be floated. For this purpose, a semiconductor substrate having a Silicon-On Isolator (SOI) structure also known as a "Silicon-On-Insulator" structure, in which an insulating layer is buried is generally used.

FIGS. 1A and 1B are a circuit diagram and a layout diagram of the cell array of a semiconductor memory device using FBCs as memory cells. FIGS. 1A and 1B illustrate that in a memory cell array in which source lines $SL_{i-1}$ and $SL_{i+1}$ are used in common and there are separately formed bit lines BL0 and BL1, one dummy line 3 is formed between memory cells. In this case, the cell area is $6F^2$. In the case where the minimum area $6F^2$ is used in order to construct the memory cell array, two word lines $WL_n$ and $WL_{n+1}$ are arranged in each active region 1, and respective active regions 1 are spaced apart from each other at a distance D, which is half the pitch of the word lines, in order to avoid data interference between the cells.

In this case, the dummy line 3 is used as a barrier when landing plug contacts are formed after a gate forming process, or is inserted in order to maintain the uniformity of gate patterning. However, in the case where the memory cell array is formed as described above, it is difficult to form the patterns of the active regions because the distance D between the active regions is narrow as shown in FIG. 1B. That is, if the ratio of the long-axis distance L of the active region 1 in a longitudinal direction to the inter-axis distance D is small (typically, L:D=2:1), Depth-of-Focus (DOF) margin in the photolithography process drastically decreases, so that the active regions 1 may not be separated from and may come into contact with is each other. This problem is more pronounced in the case where a process technology, in particular, a 100 nm or less than 100 nm process technology, is used. Although this problem may be solved by using a dual exposure process or a dual patterning process which uses a mask twice, the manufacturing process becomes complicated and the manufacturing cost increases.

SUMMARY OF THE INVENTION

Accordingly, one or more embodiments of the present invention provides a cell isolation structure using inactive transistors, which is capable of further simplifying the patterning of memory cell active regions formed in a memory cell array formed of floating body cells.

An embodiment provides a semiconductor memory device including floating body cells, including memory cell active regions formed on a Silicon-On Isolator (SOI) semiconductor substrate, a plurality of floating body cell transistors formed in the memory cell active regions, and inactive transistors for providing cell isolation that are formed between the plurality of floating body cell transistors. Here, the inactive transistors for providing cell isolation are controlled so that they always are in an OFF state while the semiconductor memory device is operating.

The semiconductor memory device may further include a plurality of word lines configured to cross the memory cell active regions, sources/drains formed on both sides of each of the plurality of word lines within each of the memory cell active regions and isolated from each other, is and body regions placed between the sources/drains, and configured to be electrically floating, wherein a part of the plurality of word lines, together with the sources/drains and the body regions, constitutes the floating body cell transistors, and wherein another part of the plurality of word lines is arranged between the word lines constituting the floating body cell transistors, thereby constituting the inactive transistors for providing cell isolation.

The sources/drains constituting the floating body cell transistors may be arranged to adjoin an oxide layer formed in the SOI semiconductor substrate. The inactive transistors for providing cell isolation may be formed of respective NMOS transistors, in which case a negative potential may be applied to the word lines constituting the inactive transistors for cell isolation.

The inactive transistors for providing cell isolation may be formed of PMOS transistors, in which case a positive potential may be applied to the word lines constituting the inactive transistors for cell isolation.

Another embodiment provides a semiconductor memory device including floating body cells, comprising a memory cell active region forming a continuous line on a Silicon-On Isolator (SOI) semiconductor substrate, a plurality of floating body cell transistors formed in the memory cell active region, wherein each of the plurality of floating body cell transistors has a floating body to store charge and change a threshold of the body cell transistor based on the stored charge, and inactive transistors for each providing cell isolation between at least two of the plurality of floating body is cell transistors, wherein the inactive transistors for providing cell isolation are controlled so that they are maintained in an OFF state while the semiconductor memory device is operating so as to isolate the at least two of the plurality of floating body cell transistors.

Yet another embodiment provides a semiconductor memory device including floating body cells, comprising a memory cell active region forming a continuous line on a Silicon-On Isolator (SOI) semiconductor substrate, a plurality of floating body cell transistors forming a part of the continuous line on the SOI semiconductor substrate, wherein each of the plurality of floating body cell transistors has a floating body to store charge and change a threshold of the body cell transistor based on the stored charge, and inactive transistors configured to be turned off throughout operations of the semiconductor memory device for each providing cell isolation between at least two of the plurality of floating body cell transistors.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
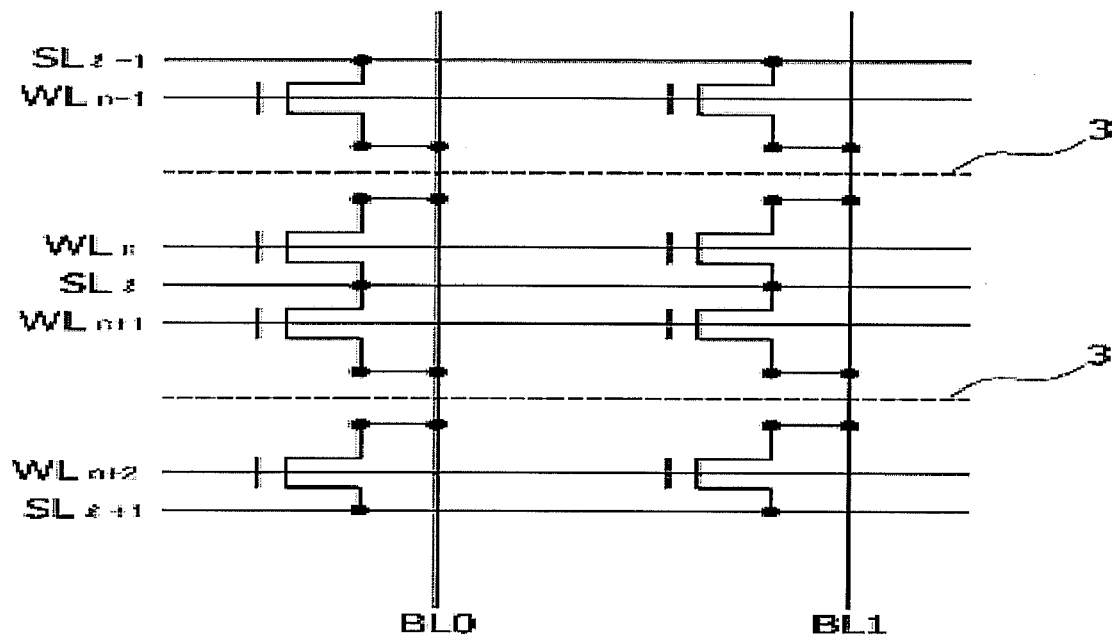
FIGS. 1A and 1B are a circuit diagram and a layout diagram of a conventional FBC memory cell array.

An embodiment of the present invention will be described in detail with reference to the accompanying drawings.

An embodiment of a semiconductor memory device according to the present invention will be described with reference to FIGS. 2 and 3. Memory cell active regions 6 are first formed on an SOI substrate in which a base substrate 9, a Buried OXide (BOX) layer 10 and an upper substrate 19 are each stacked on top of another. The memory cell active regions 6 are plural in number, and are each insulated by an isolation layer (not shown). Each of the memory cell active regions 6 is doped with a first conductive type impurity (for example, a P type impurity). A plurality of word lines crossing the memory cell active regions 6 is formed. The word lines include a gate spacer 11, including a gate insulating layer that intervenes between gate electrodes 12 and the active regions 6.

Here, the word lines $WL_n$, $WL_{n+1}$, $WL_{n+2}$ are used as the gates of cell transistors formed of floating body cells, and word lines 20 are also used as the gates of inactive transistors for providing cell isolation, which will be described later. In this case, the gates of the cell transistors and the gates of the inactive transistors for providing cell isolation are collectively referred to as the word lines because they are formed using the same patterning process. However, the word lines may constitute cell transistors or inactive transistors, which will be described in more detail below.

After the word lines have been formed, impurity doped regions having a second conductive type impurity (in the present embodiment, an N type impurity) are formed in the respective memory cell active regions 6 exposed on both sides of the word lines, thereby forming sources/drains 18. In this case, the sources/drains 18 preferably adjoin the buried oxide layer 10 buried in the SOI substrate. Accordingly, a substrate region 19a having the first conductive type impurity is placed between the neighboring sources/drains 18, and is electrically insulated by the buried oxide layer 10 under the substrate regions 19. Accordingly, the word lines $WL_{n-1}$, $WL_n$, $W_{n+1}$ and $W_{n+2}$, together with the neighboring two sources/drains 18, constitute floating body cell transistors. Here, the substrate region 19a between two sources/drains 18 constituting a floating body cell transistor is a body region, and is electrically floating due to the buried oxide layer 10 under the substrate region 19.

Meanwhile, MOS transistors, including the word lines 20 and the sources/drains 18 formed within the active region 6 on both sides of the word lines 20, function as transistors for providing cell isolation. Here, the substrate region 19a is configured to have the first conductive type impurity (that is, a P type semiconductor substrate), and both the word lines 20 and the sources/drains 18 are formed using the same process use for forming the floating body cell transistor. Accordingly, the transistors for providing cell isolation may physically have the same structure as the above-described floating body cell transistors. However, the transistors for providing cell isolation always maintain an OFF state while the semiconductor memory device is operating, as will be described later. Furthermore, the word lines 20 are arranged between the word lines $WL_{n-1}$, $W_{n+1}$ and $W_{n+2}$ constituting the floating body cell transistors.

Figure 2:
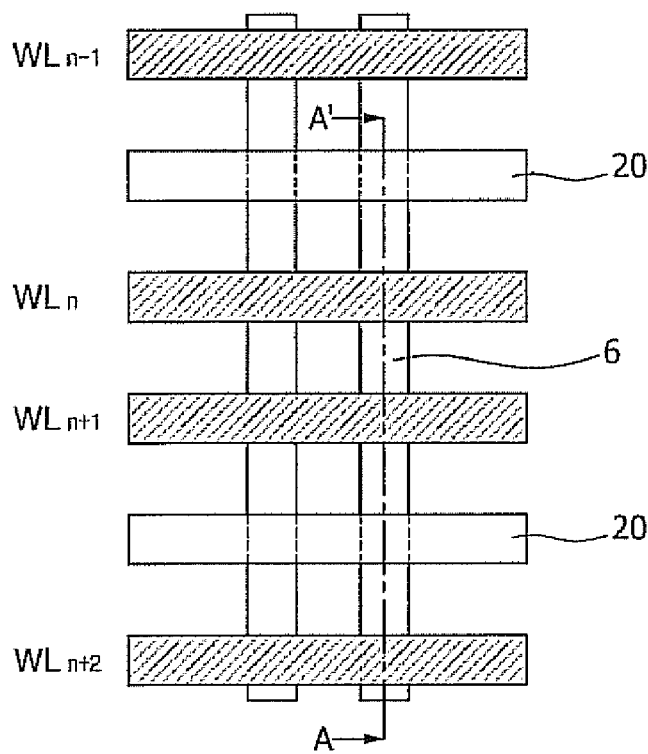
FIG. 2 is a layout diagram of an FBC memory device in which a cell isolation structure using inactive transistors is formed according to the present invention.
Figure 3:
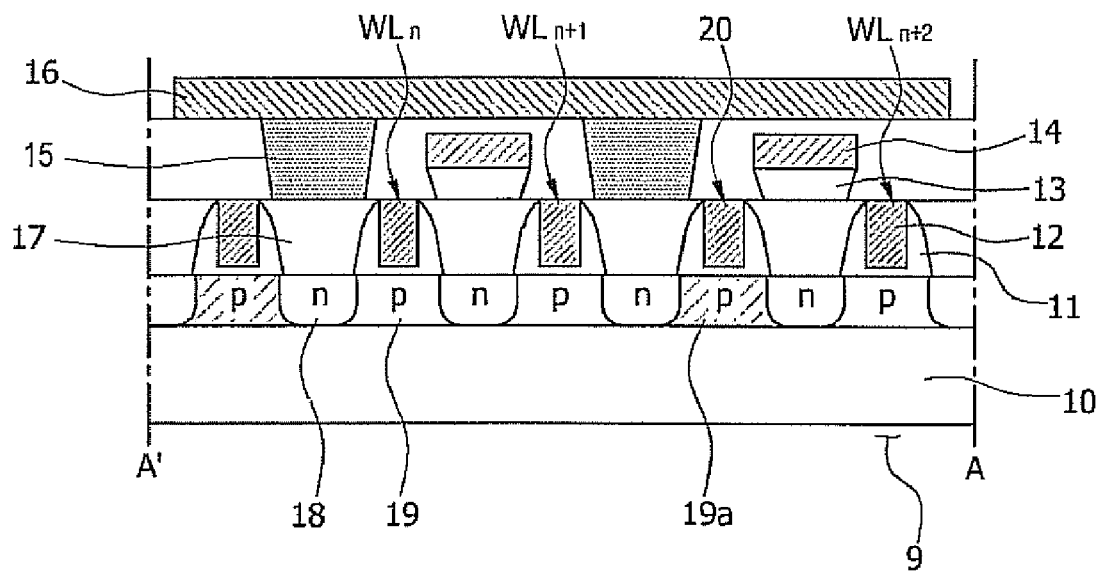
FIG. 3 is a cross-sectional view of the FBC memory device in which a cell isolation structure using inactive transistors is formed according to the present invention, and is a cross-sectional view of the FBC memory device taken along line A'-A of FIG. 2.

Thereafter, the semiconductor memory device shown in FIGS. 2 and 3 is fabricated by sequentially forming landing plug contacts 17, source line contacts 13, source lines 14, bit line contacts 15 and bit lines 16.

Figure 1B:
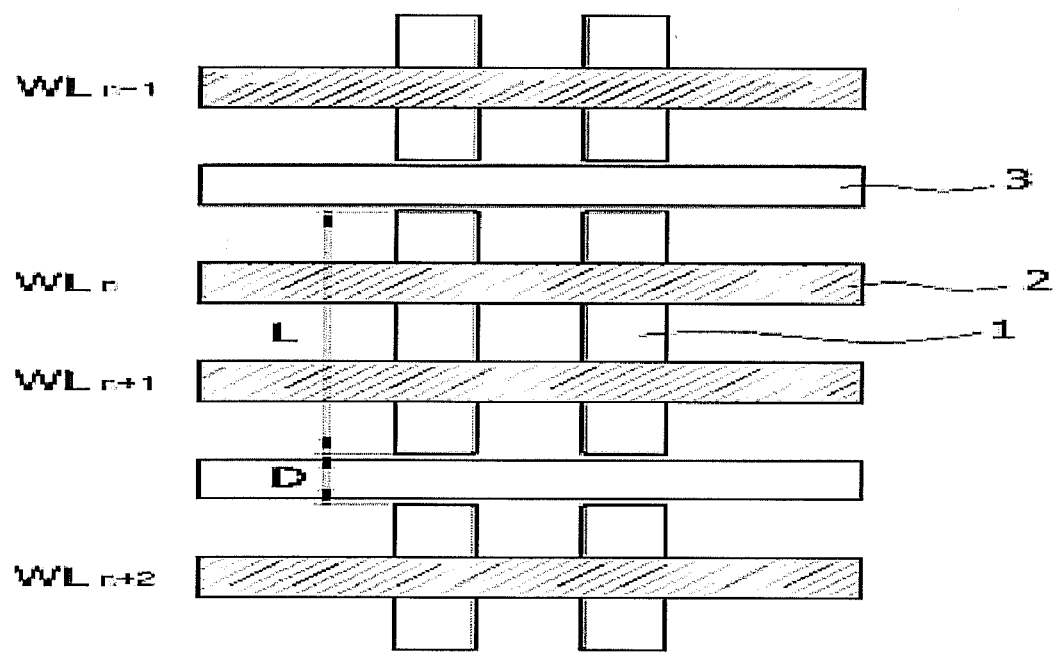

Referring to the layout diagram shown in FIG. 2, in the memory cell array of the semiconductor memory device according to the present invention, each of the active regions 6 is formed in a line with a specific width. In this case, there are the following advantages as compared with the conventional semiconductor memory device shown in FIG. 1B. First, the active regions 1 formed in the cell array of the conventional semiconductor memory device shown in FIG. 1B are configured to have the long-axis distance L in a longitudinal direction, and are spaced apart from the neighboring active regions at the inter-axis distance D in a longitudinal direction. That is, in the conventional semiconductor memory device, two floating body cells, as shown in FIG. 1B, are included in one active region 1 formed as an island in order to isolate data cells. In the present invention, however, three or more memory cells may be formed in one active region 6. Accordingly, unlike in the prior art, the active region 6 may be formed in a line of memory cells, rather than as an island separating memory cells, and the long-axis distance of the active region 6 in a longitudinal direction may be designed by a manufacturer so that the long-axis distance has a desired value. Consequently, in the case where a memory device having a minimum cell formation area is fabricated by using the 100 nm or less than 100 nm process technology, a complicated dual exposure process or a dual patterning process does not need to be performed when memory cell active regions are patterned, thereby being capable of avoiding an overlapping problem as in the conventional active regions. Accordingly, the process of manufacturing semiconductor memory devices can be further simplified, and the manufacturing cost thereof can be reduced.

The reason that the memory cell active regions 6 can be formed in a line as described above is that in the present invention, the inactive transistors for providing cell isolation are formed in order to isolate data cells. The inactive transistors for cell isolation include the word lines 20, the sources/drains 18 and the substrate regions 19a, and maintain an OFF state while the semiconductor memory device is operating and may not turn on during the operation. The inactive transistors for providing cell isolation may physically have the same structure as neighboring floating body cell transistors. However, each of the inactive transistors for providing cell isolation is controlled to be in an OFF state (an inactive state) regardless of a control signal applied to the neighboring sources/drains 18.

For example, referring to FIG. 3, the word line 20 constituting the inactive transistor for providing cell isolation is arranged between the word lines $WL_{n+1}$ and $WL_{n+2}$ constituting a floating body cell transistor. Here, a control signal for making the inactive transistor for cell isolation to is enter an OFF state is applied to the word line 20 constituting the inactive transistor. For example, in the case where the inactive transistor is formed of an NMOS transistor as in the present embodiment, a negative potential (that is, a gate voltage (Vg<0)) is applied to the word line 20. In the case where the inactive transistor is formed of a PMOS transistor, a positive potential (Vg>0) is applied to the word line constituting the inactive transistor for cell isolation. If the transistor for cell isolation may maintain an OFF state (for example, at all times during an operation of the cell) regardless of the control signal applied to neighboring floating body cell transistors as described above, data cells (that is, an FBC including the word line $WL_{n+1}$ and an FBC including the word line $WL_{n+2}$) are isolated from each other within the active region 6.

In the semiconductor memory device according to the present invention, the word lines 20 constituting the inactive transistors for providing cell isolation may be controlled so that all transistors for providing cell isolation enter an OFF state by using a common bias. In this case, the bias level may be controlled depending on the doping level of the MOS transistors and the thickness of the buried oxide layer of the SOL In the conventional FBC memory cell array, the active regions each including two memory cells are patterned as islands and are isolated from each other at specific intervals. In the FBC memory cell array according to the present invention, the active regions can be formed in a line without limitation on the length in a longitudinal direction. In the present invention, the isolation between neighboring data cells can be achieved through an inactive transistor for providing cell isolation which is controlled so that it is maintained in an OFF state while a memory device is operating. Accordingly, according to the present invention, the process of manufacturing an FBC memory device can be further simplified and the manufacturing cost of devices can be reduced. Eventually, there is an advantage in that a memory cell formation area can be minimized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device including floating body cells, comprising:
    memory cell active regions formed on a Silicon-On Isolator (SOI) semiconductor substrate;
    a plurality of floating body cell transistors formed in the memory cell active regions; and
    inactive transistors for providing cell isolation that are formed between the plurality of floating body cell transistors;
    wherein the inactive transistors for providing cell isolation are controlled so that they are in an OFF state while the semiconductor memory device is operating.

2. The semiconductor memory device as set forth in claim 1, further comprising:
    a plurality of word lines configured to cross the memory cell active regions;
    sources/drains formed on both sides of each of the plurality of word lines within each of the memory cell active regions and isolated from each other; and
    body regions placed between the sources/drains, and configured to be electrically floating;
    wherein a part of the plurality of word lines, together with the sources/drains and the body regions, constitutes the floating body cell transistors; and
    wherein another part of the plurality of word lines is arranged between the word lines constituting the floating body cell transistors, thereby constituting the inactive transistors for providing cell isolation.

3. The semiconductor memory device as set forth in claim 2, wherein the sources/drains constituting the floating body cell transistors are arranged to adjoin an oxide layer formed in the SOI semiconductor substrate.

4. The semiconductor memory device as set forth in claim 2, wherein:
    the inactive transistors for providing cell isolation are formed of respective NMOS transistors, and
    a negative potential is applied to the word lines constituting the inactive transistors for cell isolation.

5. The semiconductor memory device as set forth in claim 2, wherein:
    the inactive transistors for providing cell isolation are formed of PMOS transistors, and
    a positive potential is applied to the word lines constituting the inactive transistors for cell isolation.

6. A semiconductor memory device including floating body cells, comprising:
    a memory cell active region forming a continuous line on a Silicon-On Isolator (SOI) semiconductor substrate;
    a plurality of floating body cell transistors formed in the memory cell active region, wherein each of the plurality of floating body cell transistors has a floating body to store charge and change a threshold of the body cell transistor based on the stored charge; and
    inactive transistors for each providing cell isolation between at least two of the plurality of floating body cell transistors;
    wherein the inactive transistors for providing cell isolation are controlled so that they are maintained in an OFF state while the semiconductor memory device is operating so as to isolate the at least two of the plurality of floating body cell transistors.

7. The semiconductor memory device as set forth in claim 6, wherein word lines form gates of the floating body transistors, the semiconductor memory device further comprising:
    bit line contacts and bit lines formed on top of the floating body cell transistors and over the SOI semiconductor substrate.

8. The semiconductor memory device as set forth in claim 6, wherein each of the floating bodies is configured to electrically float between a source and a drain of the respective floating body cell transistor.

9. The semiconductor memory device as set forth in claim 8, wherein the source and the drain of said respective floating body cell transistor adjoin an oxide layer formed in the SOI semiconductor substrate.

10. The semiconductor memory device as set forth in claim 6, wherein:
the inactive transistors for providing cell isolation are each formed of an NMOS transistor configured to receive a low gate voltage during the operation of the semiconductor memory for providing cell isolation.

11. The semiconductor memory device as set forth in claim 6, wherein:
the inactive transistors for providing cell isolation are each formed of a PMOS transistor configured to receive a high gate voltage during the operation of the semiconductor memory for providing cell isolation.

12. A semiconductor memory device including floating body cells, comprising:
a memory cell active region forming a continuous line on a Silicon-On Isolator (SOI) semiconductor substrate;
a plurality of floating body cell transistors forming a part of the continuous line on the SOI semiconductor substrate, wherein each of the plurality of floating body cell transistors has a floating body to store charge and change a threshold of the body cell transistor based on the stored charge; and
inactive transistors configured to be turned off throughout operations of the semiconductor memory device for each providing cell isolation between at least two of the plurality of floating body cell transistors.

13. The semiconductor memory device as set forth in claim 12, wherein word lines form gates of the floating body transistors, the semiconductor memory device further comprising:
bit line contacts and bit lines formed on top of the floating body cell transistors and over the SOI semiconductor substrate.

14. The semiconductor memory device as set forth in claim 12, wherein each of the floating bodies is configured to electrically float between a source and a drain of the respective floating body cell transistor.

15. The semiconductor memory device as set forth in claim 14, wherein the source and the drain of said respective floating body cell transistor adjoin an oxide layer formed in the SOI semiconductor substrate.

16. The semiconductor memory device as set forth in claim 12, wherein:
the inactive transistors for providing cell isolation are each formed of an NMOS transistor configured to receive a low gate voltage during the operations of the semiconductor memory for providing cell isolation.

17. The semiconductor memory device as set forth in claim 12, wherein:
the inactive transistors for providing cell isolation are each formed of a PMOS transistor configured to receive a high gate voltage during the operations of the semiconductor memory for providing cell isolation.

* * * * *